United States Patent
Kelly

(10) Patent No.: US 8,081,928 B2
(45) Date of Patent: Dec. 20, 2011

(54) CANCELING HARMONICS IN SEMICONDUCTOR RF SWITCHES

(75) Inventor: Dylan J. Kelly, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 1258 days.

(21) Appl. No.: 11/347,671

(22) Filed: Feb. 3, 2006

(65) Prior Publication Data
US 2006/0194558 A1 Aug. 31, 2006

Related U.S. Application Data

(60) Provisional application No. 60/650,032, filed on Feb. 3, 2005.

(51) Int. Cl.
*H04B 1/00* (2006.01)
(52) U.S. Cl. ............ 455/63.1; 455/67.13; 333/101; 333/103
(58) Field of Classification Search .......... 455/333, 455/63.1, 114.2, 114.1, 278.1, 424, 425, 455/456.6, 550.1, 561, 575.1, 67.11, 295, 455/296, 191.3, 277.1, 197.1; 330/149, 150; 333/103, 104, 101, 262; 327/408, 430, 435, 327/436, 416, 427; 343/876
See application file for complete search history.

(56) References Cited

U.S. PATENT DOCUMENTS

| | | | | |
|---|---|---|---|---|
| 4,825,145 A | * | 4/1989 | Tanaka et al. | 323/315 |
| 4,999,585 A | * | 3/1991 | Burt et al. | 330/149 |
| 5,012,123 A | | 4/1991 | Ayasli et al. | |
| 5,774,792 A | * | 6/1998 | Tanaka et al. | 455/78 |
| 5,818,283 A | * | 10/1998 | Tonami et al. | 327/436 |
| 6,310,508 B1 | * | 10/2001 | Westerman | 327/374 |
| 6,316,983 B1 | * | 11/2001 | Kitamura | 327/317 |
| 6,704,550 B1 | * | 3/2004 | Kohama et al. | 455/114.2 |
| 6,882,210 B2 | * | 4/2005 | Asano et al. | 327/403 |
| 6,903,596 B2 | * | 6/2005 | Geller et al. | 327/427 |
| 7,057,472 B2 | * | 6/2006 | Fukamachi et al. | 333/101 |
| 7,199,635 B2 | * | 4/2007 | Nakatsuka et al. | 327/308 |
| 2002/0126767 A1 | * | 9/2002 | Ding et al. | 375/296 |
| 2003/0160515 A1 | * | 8/2003 | Yu et al. | 307/105 |
| 2005/0212595 A1 | * | 9/2005 | Kusunoki et al. | 330/149 |
| 2005/0264341 A1 | * | 12/2005 | Hikita et al. | 327/427 |

(Continued)

OTHER PUBLICATIONS

Weman, Eva, Communication under Rule 71(3) EPC received from the EPO for related appln. No. 02800982.7-220 dated Nov. 27, 2010, 60 pages.

(Continued)

*Primary Examiner* — Duc Nguyen
*Assistant Examiner* — Charles Chow
(74) *Attorney, Agent, or Firm* — Jaquez & Associates; Martin J. Jaquez, Esq.; Merle W. Richman, Esq.

(57) ABSTRACT

An RF switching circuit adapted to cancel selected harmonic signals. An unwanted harmonic signal Sh1 at a selected harmonic frequency Fsh of an operating frequency Fo exists in a signal Si conducted by the switching circuit, possibly produced by the switching circuit due to conduction through a first nonlinear impedance Znl(1). A compensating harmonic signal Sh2 is therefore generated by conduction via a nonlinear impedance Znl(2). Znl(1) may be due to parasitic conduction by "off" switching elements, while Znl(2) may be due to conduction by an "on" FET. The amplitude and/or phasing of Sh2 may be adjusted by selecting components for a network coupling Znl(2) to the conducted signal Si, such that Sh2 substantially cancels Sh1 across a target range of input power.

20 Claims, 6 Drawing Sheets

U.S. PATENT DOCUMENTS

2007/0290744 A1* 12/2007 Adachi et al. .................. 330/51

OTHER PUBLICATIONS

Weman, Eva, Communication under Rule 71(3) EPC received from the EPO for related appln. No. 02800982.7-220 dated Nov. 27, 2009, 60 pages.

Kelly, Dylan, et al., Response and Terminal Disclaimers filed in the USPTO for related U.S. Appl. No. 11/347,014, dated Mar. 16, 2010, 5 pages.

Shifrin, Mitchell, et al., "Monolithic FET Structures for High-Power Control Component Applications", IEEE Transactions on Microwave Theory and Techniques, vol. 37, No. 12, Dec. 1989, pp. 2134-2141.

Hoffmann, N., Summons to Attend Oral Proceedings Pursuant to Rule 115(1) EPC received from the EPO dated Jul. 22, 2011 for related appln. No. 06786943.8, 8 pgs.

* cited by examiner

CANCELING HARMONICS IN SEMICONDUCTOR RF SWITCHES

CROSS REFERENCE TO RELATED APPLICATIONS

This application claims the benefit under 35 USC 119 of U.S. Provisional Application 60/650,032, filed Feb. 3, 2005 and entitled "Canceling Harmonics in Semiconductor RF Switches," and is related to currently pending and commonly owned U.S. patent application Ser. No. 10/922,135, filed Aug. 18, 2004 and entitled "Switch Circuit and Method of Switching Radio Frequency Signals," which in turn claims priority to U.S. patent application Ser. No. 10/267,531 (now U.S. Pat. No. 6,804,502), filed Oct. 8, 2002 and entitled "Switch Circuit and Method of Switching Radio Frequency Signals"; and each of these documents is hereby incorporated herein in their entireties by reference.

BACKGROUND OF THE INVENTION

1. Field of the Invention

The present invention relates to semiconductor switching of radio frequency (RF) signals, and in particular to targeted cancellation of harmonics of a fundamental operating frequency (Fo) of an RF signal.

2. Description of Related Art

Radio frequency (RF) switches and power amplifiers are important building blocks in wireless communication systems, and are found in most common transceivers, such as cellular telephones. RF switch performance is gauged according to several operating parameters, including: insertion loss, switch isolation, the "1 dB compression point," and switching speed. Optimizing these parameters is a primary design goal of any RF switch design. However, because an RF switch is often coupled directly to a transmitting antenna, another important performance criterion is the ability of an RF switch to avoid generating unwanted harmonic content.

FIG. 1a is a simplified schematic diagram of a typical single-pole, single-throw (SPST) RF switch 10, including input clamping. An input node 1 is coupled to a source, such as the output from a power amplifier in the transmitter section of a transceiver. The source is represented as a sinusoidal signal source in series with equivalent impedance R0 9, which, ideally, is perfectly resistive. When biased "on," a switch M1 5 couples the source signal to an output node 3. The output node 3 is typically coupled to an antenna. M1 5 is biased "on" by providing an appropriate voltage at the DC ON control node of R1, the other side of which is coupled to the gate of M1 5. When M1 is off, a switch M2 7 is typically turned on to clamp the input to a common voltage. Such clamping reduces pass-through of signals between the unused input node 1 and the output node 3 due to incidental conduction on M1 5. As such, appropriate "off" biasing must be concurrently provided to the DC OFF node of resistor R2 to turn off the clamping switch MOSFET M2 7. Conversely, when M1 is biased on and M2 is biased off, the source at node 1 is coupled to the output node 3. The output node 3 is coupled in turn to a load 11. The load 11 is represented in FIG. 1 by resistor RO1, but in practice is typically an antenna, to which the output node 3 is coupled via a transmission line.

FIG. 1b is a simplified schematic of the circuit of FIG. 1a, further illustrating some details of parasitic element equivalent circuits. When properly biased "off," M1 has almost infinite resistance from drain to source through its channel. However, there is a finite capacitance Cds1 19 from drain to source. Cds1 19 may be significantly due to a series combination of the "off" gate capacitances to drain and to source, Cgd off 15 and Cgs off 17, respectively. M2, which is properly biased "on," also includes a parasitic drain-source capacitance Cds, but it Cds has little effect due to the low on resistance of the channel, represented as r1, that parallels it. However, the "on" gate capacitances to drain and source, Cgd on and Cgs on, continue to provide a conduction path between the channel and the gate resistor R2.

FIG. 2 is a simplified schematic diagram illustrating a single pole double throw (SPDT) switch, fabricated by combining two SPST switches such as shown in FIG. 1. The SPDT switch of FIG. 2 has an RF common connection 25, which is typically coupled to an antenna via a transmission line. In a first state, the RF common 25 may be coupled to $RF_1$ 21 via a FET 23 that is biased "on.") In this state a FET 28 is also biased "on," while FET 24 and 27 are biased "off." In an alternative second state, RF common 25 may be coupled to $RF_2$ 22. In this second state, FETs 24 and 27 are biased "on," while FETs 23 and 28 are biased "off." Just two drive signals are needed to switch the elements between the first and second states: SW and its inverse, SW_. When SW is "on" or true, SW_ is "off" or false, and vice versa.

RF switches have heretofore been implemented in various component technologies, including bulk complementary-metal-oxide-semiconductor (CMOS) and gallium-arsenide (GaAs) technologies. Indeed, most high performance high-frequency prior art switches use GaAs technology. Prior art RF switch implementations have attempted to improve the RF switch performance with mixed results, and with varying degrees of integrated circuit complexity and yield. For example, bulk CMOS RF switches disadvantageously exhibit high insertion loss, low compression, and poor linearity performance characteristics. In contrast, due to the semi-insulating nature of GaAs material, parasitic substrate resistances can be greatly reduced using these materials, thereby reducing RF switch insertion loss. Similarly, the semi-insulating GaAs substrate improves switch isolation.

Although GaAs RF switch implementations offer good performance characteristics, the technology has several disadvantages. For example, GaAs technology exhibits relatively low yields of properly functioning integrated circuits. GaAs RF switches tend to be relatively expensive to design and manufacture. In addition, although GaAs switches exhibit good insertion loss characteristics as described above, they may have low-frequency limitations due to slow states that are present in the GaAs substrate. The technology also does not lend itself to high levels of integration. Consequently, complex digital control circuitry associated with GaAs RF switches must be implemented "off chip" from the switch. Even the low power control circuitry associated with the switch has proven difficult to integrate. This is disadvantageous because it increases the overall system cost for manufacturing circuits of a given size and complexity, as well as reducing system throughput speeds.

Moreover, GaAs designs and methodologies, which typically employ non-insulating, junction-based FETs, are often incompatible with technologies that employ insulating gate FETs, such as CMOS. Though the same schematic symbols are often used for both types of FETs (GaAs MESFETs and MOSFETs in, e.g., silicon), they do not behave similarly. GaAs circuits often rely upon conduction through forward-biased gate junctions to properly bias a circuit. Consequent to this and other distinctions, one cannot presume that substituting CMOS devices according to a GaAs design will result in a circuit that will function as intended, or indeed will function at all.

Devices that use semiconductor RF signal switching circuits, such as cellular telephones, operate in crowded RF spectrums, and are stringently regulated in regard to spurious emissions. Because failure to comply with regulatory limits can make an entire device unmarketable, it is crucial that the component RF signal switching circuits in such devices avoid contributing harmonic power that could cause such a failure. Unfortunately, semiconductor devices in such switches are never "ideal." Some non-ideal characteristics will inevitably introduce distortion into the signal being transmitted, inducing unwanted signal content at harmonics of the fundamental transmission operating frequency, Fo. The amount of distortion, as well as the resultant magnitude of the resulting harmonic signals, is often a function of the amplitude or power of the output signal. Accordingly, such harmonic distortion may restrict the power handling capability of the switch.

In addition to enabling fabrication of an integrated RF signal switching circuit having improved performance characteristics in terms of insertion loss, isolation, and compression, it is also desirable to enable fabrication of an RF switch having reduced levels of harmonic content. Methods and circuits are therefore set forth herein that may enhance performance, and are in particular suitable for reducing the harmonic content of an RF signal conducted by a semiconductor RF switch circuit.

SUMMARY OF THE INVENTION

Methods and circuits are described herein that enable unwanted harmonic content to be canceled from an input signal being conducted by an RF switching circuit, by establishing compensation current that is appropriately distorted due to conduction from the input signal via a nonlinear impedance, thereby creating a compensation signal to at least partly cancel an unwanted harmonic signal.

A first set of embodiments includes a method of canceling unwanted harmonic content in an input signal Si that is conducted by a semiconductor signal switching circuit. The method includes controlling conduction of Si through a nonlinear compensation impedance Znlc to a reference voltage Vref. In some of these embodiments, Znlc includes a conduction impedance of an FET. Znlc may be a capacitive impedance that increases with increasing voltage across the capacitance. Some of these embodiments include coupling current from Si to a nonlinear impedance of a switch driver circuit, which may be configured to control conduction of a signal. In others of the first set of embodiments, Znlc may include nonlinear drain-source capacitance between a channel and a gate of an FET that is biased fully off. In some of these embodiments, Znlc is an impedance that decreases with increasing voltage. Znlc may be coupled between Si and Vref via circuit elements that control a frequency-dependent amplitude and a phasing of resulting current.

The unwanted harmonic content may include an undesired harmonic signal component Sh1 at a specific harmonic frequency Fsh of an operating frequency Fo of the input signal Si. Current that is intentionally distorted by conduction through Znlc may generate a harmonic compensation signal Sh2 at the frequency Fsh. The circuit elements that couple Si to Znlc may control phasing of Sh2 such that it cancels at least part of the undesired harmonic signal Sh1. Said circuit elements may be passive elements, and, if so, may be substantially limited to resistive and capacitive elements, or may further include inductive elements. Useful cancellation of Sh1 by Sh2 may be designed to occur primarily across a limited range of amplitude of the input signal.

In some of the first set of embodiments, the unwanted harmonic content is induced in Si by elements of the switching circuit. In some of such embodiments, the unwanted harmonic content results from the input signal being coupled through a nonlinear capacitance, and in at least one such embodiment the nonlinear capacitance is a parasitic drain-source capacitance of an FET that is biased "off." In others of such embodiments, the unwanted harmonic content results from a nonlinear conduction impedance via which the switch circuit couples Si from an input node Ni to an output node Nout. Some embodiments include generating a compensating signal Sh2 by conducting compensating current from Si through a driver device that controls a conduction path element of the switching circuit.

In regenerative embodiments, Sh2 may be induced onto Si by coupling to a conduction path of Si an actively amplified signal resulting from current that has been coupled through Znlc. In such embodiments, phase and amplitude control networks may be disposed in the coupling to Znlc, or in the coupling of the amplified signal to Si. In passive embodiments, on the other hand, Sh2 may be induced onto Si by substantially passive conduction of currents through an effective source impedance of Si.

More detailed embodiments of the first harmonic cancellation method set forth above may be defined by adding any combination of one or more of the requirements set forth below, such that each practical combination of the first harmonic cancellation method with one or more requirements below thus corresponds to a different embodiment of the method.

The cancellation harmonic signal Sh2 caused by the compensation nonlinear impedance Znlc may be required to be substantially opposite in phase to Sh1. The harmonic cancellation path Pch may be required to include reactive elements selected to adjust a phase of harmonic compensation current Ich by controlling a phase of the overall impedance of Pch, Zpc. Pch may be required to include a series coupling capacitor Cc. If included, a coupling capacitor Cc in series with Pc may establish a transfer function "zero" for Zpc at a corner frequency that is within two octaves below the selected harmonic frequency Fsh.

A second set of embodiments includes a switching circuit for coupling an input signal Si from an input node Ni to an output node Nout with cancellation from Si of at least one unwanted harmonic component signal Sh1 at a frequency Fsh that is a selected harmonic of an operating frequency Fo of Si. The switching circuit includes circuitry coupling Si to a reference voltage Vref via a compensating nonlinear impedance Znlc to generate a second harmonic component signal Sh2 on Si, where Sh2 approaches equal magnitude and opposite phase to Sh1 at Fsh over a selected range of amplitudes of Si.

The switching circuit may include a nonlinear distortion impedance Znld that induces the unwanted harmonic signal Sh1 onto Si. The magnitude of Znld changes as a function of the voltage across it, and the magnitude of Znlc changes as a function of its current. These two nonlinear impedances may be different in a manner that helps establish phase opposition between the resulting harmonic signals Sh1 and Sh2. They may differ in that one is primarily capacitive, while the other is primarily resistive; or the magnitude of one may decreases with voltage, while the magnitude of the other increases with voltage. Znld may be substantially composed of switching elements that are biased "off" but have finite, nonlinear capacitive conduction; while Znlc may be substantially based on conduction characteristics of an FET that is biased "on." However, in alternative groups of embodiments Znld and Znlc may have similar nonlinearities, and indeed may be based upon the same FET conduction characteristics. In a particular example, a portion of the current through Znld may be sampled, or comparable current to Inld may be generated, and in either case the current thus obtained may be amplified, and the phase inverted and/or adjusted as needed, in order to develop the compensating signal Sh2.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Figure 2:
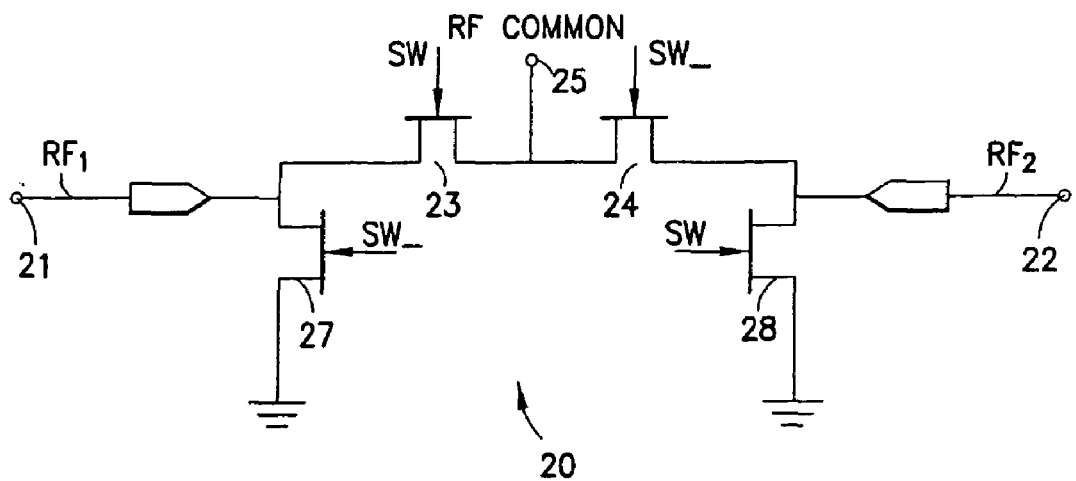
FIG. 2 is a simplified schematic diagram of a prior art single pole double throw (SPDT) RF switch with source shunting.
Figure 3:
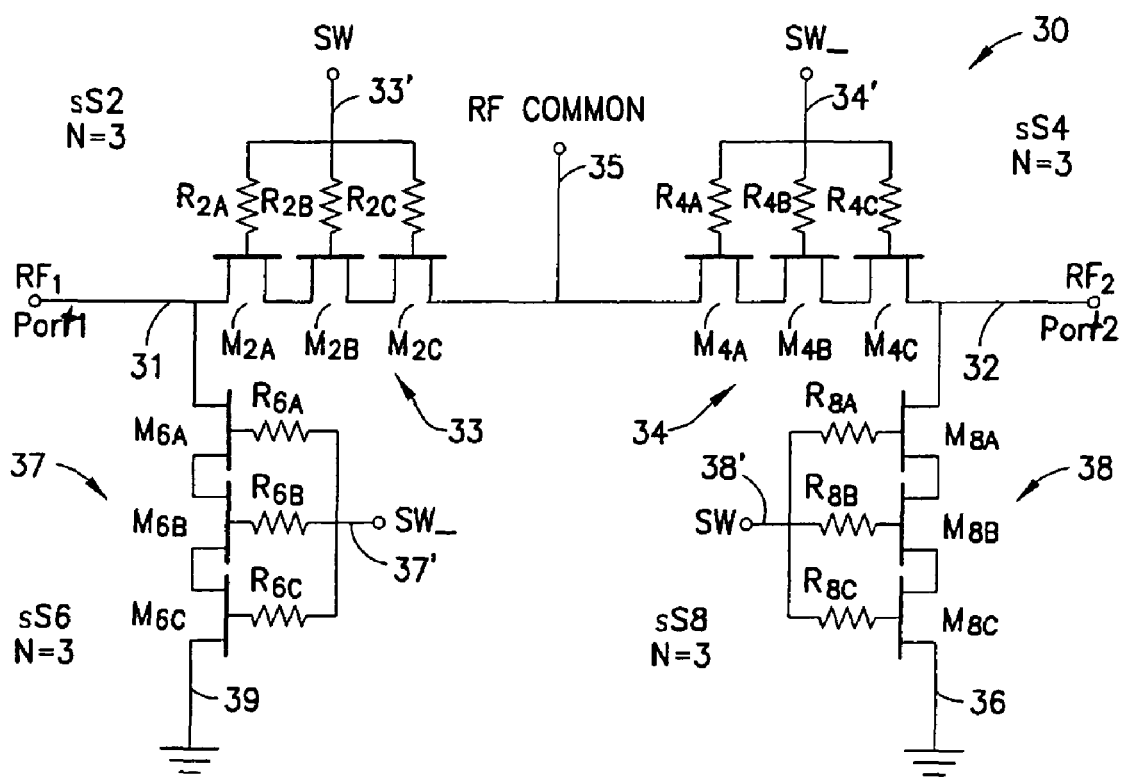
FIG. 3 is a simplified schematic diagram of an SPDT RF switch in which switch elements are series multiply stacked FETs.

FIG. 3 represents four semiconductor switching elements that function as an SPDT RF switch 30, similarly as the RF switching circuit described above with reference to FIG. 2. RF switch 30 includes input clamps to prevent signal feedthrough between an unselected input and the conducted signal. Switching elements 33, 34, 37 and 38 are each a FET "stack" that has three insulated gate FETs (such as MOSFETS) coupled in series. The gate of each of the FETs in a stack is coupled to a control voltage (SW or its inverse, SW_) via a gate resistance. If the gate RC product (gate resistance multiplied by the corresponding gate-channel capacitance) of each FET in a stack is substantially the same, and is long compared to the period of the signal being switched, then this arrangement will distribute the voltage applied to the switching element fairly uniformly over all of the FETs of the stack. Such uniform distribution enhances the voltage capacity of the switching element, raising it to N times the voltage capacity of an individual FET, where N is the number of FETs in the stack, and increases the 1 dB compression point. High gate resistance is good, but does extend the time required to reverse the bias polarity on the gate, which must be done to change from one switch state to another.

The gate bias resistors $R_{2A}$, $R_{2B}$ and $R_{2C}$ provide the FETs $M_{2A}$, $M_{2B}$ and $M_{2C}$ with bias having a DC value equal to SW. If the FETs are N-channel, a high value of SW biases them all "on" for a zero-average source voltage. Because the input signal period is short compared to the gate RC time constant, and the "on" channel impedances are low, the gate and channel voltages will all vary with the input voltage. Thus, for sufficiently high signal frequencies, these stacked FETs function, together with their associated gate resistances, as a single switching element sS2 33. [The designation form "sSx" indicates a stacked switching element of reference number x. A number N associated with such devices indicates the number of FETs in the stack. In FIG. 3, N=3 for each of the switching elements sS2 33, sS4 34, sS6 37 and sS8 38.] sS2 thus couples Port1 31 to the RF Common 35 when SW is high.

FIG. 3 thus may be seen to have the same SPDT switch topology as FIG. 2, including clamps for unused inputs. The single FET switching devices of FIG. 2 have been replaced by stacked-FET elements and their gate resistances: sS6 37 replaces FET 27, sS2 33 replaces the FET 23, sS4 34 replaces the FET 24, and sS8 38 replaces the FET 28. When SW is an "on" voltage and SW_ is an "off" voltage, sS6 37 is "off" and does not clamp Port1 31 to ground; instead, Port1 31 is coupled to RF Common 35 via sS2 33, which is "on." Port2 32 is isolated from RF Common 35 because sS4 34 is "off," and is furthermore clamped to ground by sS8 38, which is "on."

When SW is appropriately high, SW_is sufficiently low to bias "off" the FETs of sS4 34 for a zero source voltage (the FETs are n-channel; control voltages would of course reverse for p-channel FETs). The channels of the individual FETs of sS4 34 are therefore isolated from each other. Because of the large value of the gate RC product compared to the period of the switched signal, the gate voltage tracks the channel voltage, offset by the effectively DC bias voltage. Consequently, the gate of an FET on a particular end of a stack, e.g. $M_{4A}$, tracks the average voltage on the channel, which at one end is RF Common 35. sS8 38 couples Port2 32 to ground, to a net effect that the voltage of RF Common 35 is distributed reasonably uniformly across all N FETs of the stacked switching element sS4 34. N=3 for each of the stacked switches of FIG. 3, but stacked devices may be constructed with many different values of N. As one example, N=8 for all of the stacked switch elements of FIG. 8.

Minimizing gate-channel voltages is useful because it permits minimizing gate oxide thicknesses and enhances FET performance. To this end, it will be helpful to fabricate the switching FETs to establish threshold voltages such that the gate voltage (with respect to the source voltage) that causes full conduction is approximately equal in magnitude to the gate voltage that fully turns the FET off, but of opposite polarity. To utilize devices thus fabricated, a negative bias voltage must be provided, ideally such that the control voltages may be symmetrical around ground. Some fully integrated RF switches operate from a single voltage supply, incorporating a charge pump as part of the monolithic integrated circuit to provide the negative bias voltage. Silicon on insulator (SOI) technologies such as silicon on sapphire, and particularly ultra-thin silicon on insulator or UTSi, are desirable for such switches in part because they are compatible with significant levels of integration. Monolithic integrated circuits fabricated in such technologies can incorporate all of the switching elements, the charge pump elements for providing negative bias, and the control logic such as is described below. U.S. Pat. No. 6,804,502 provides extensive detail in regard to fabrication of such RF switches.

Figure 4:
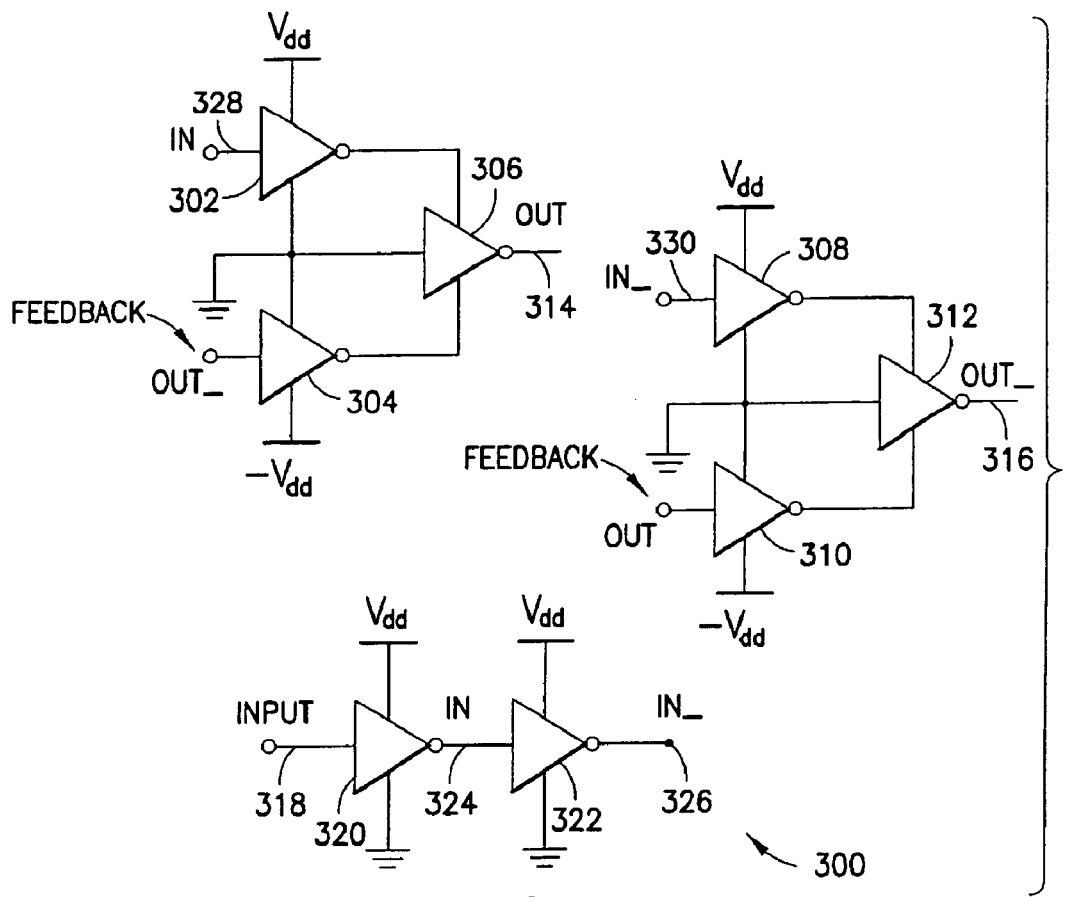
FIG. 4 is a schematic diagram of a level shifting circuit.

An RF switching circuit is typically presented with unipolar (typically positive) control voltages with respect to ground. Because switching elements are best controlled by a bipolar control signal, a level shifting circuit such as shown in FIG. 4 is employed to translate the unipolar control voltages to switching element control voltages that are driven to either a positive supply voltage Vdd, or to a negative supply voltage −Vdd. Balanced bias voltages may help minimize gate-channel voltages, and balanced positive and negative supplies may help to achieve balanced bias voltages, yet unbalanced supplies and bias voltages may be best for some designs. Some preferred embodiments employ Vdd=3 VDC and Vss=−Vdd=−3 VDC.

Level shifting circuit 300 of FIG. 4, hereinafter referred to as the level shifter 300, comprises a plurality of inverters coupled in a feedback configuration. More specifically, the level shifter 300 includes two groups of inverters used to generate first and second shifted output signals, "out" on a first output node 314, and its inverse "out_" on a second output node 316. The first group of inverters comprises inverters 302, 304 and 306. A second group of inverters comprises inverters 308, 310 and 312. A typical or "normal" digital input signal (i.e., a digital input signal that ranges from GND to +Vdd) is input to the level shifter 300 at an input node 318 of a first inverter 320. The first inverter 320 generates a first input signal "in" (on an output node 324) which is input to a second inverter 322. The second inverter 322 generates a second input signal "in_", the inverse of the first input signal "in", on an output node 326. Therefore, the first and second inverters, 320, 322, generate the signals that are input to the two groups of inverters described above. For example, the first input signal "in" is coupled to the input 328 of the inverter 302. Similarly, the second input signal "in_" is coupled to the input 330 of the inverter 308.

The output of the first group of inverters, "out", is generated by a first output inverter 306, and is provided on a first output node 314. The output of the second group of inverters, "out_", is generated by a second output inverter 312, and is provided on a second output node 316. The two level shifter outputs, "out" and "out", serve as inputs to circuits, such as shown in FIG. 3, which benefit from a bipolar control signal. In particular, these two signals may serve as SW and SW_, respectively, in FIG. 4.

The level shifter 300 of FIG. 4 shifts the DC level of an input signal (i.e., the input signal provided on the input node 318) while leaving the frequency response of the input signal unchanged. The inverters of the level shifter 300 operate on a differential basis, i.e., the level shifter shifts the digital input signals based upon the difference between two voltage signals. More specifically, as long as the difference between the power supply signals provided to the inverters (such as, for example, the output inverters 306 and 312) is on the order of Vdd, the level shifter 300 reliably functions to shift the input signals to a range between −Vdd to +Vdd. In one embodiment, Vdd is equal to 3 VDC. In this embodiment, the transistors comprising the inverters of the level shifter 300 (e.g., the output inverters 306 and 312) never have greater than 3 VDC applied across their source/drain nodes. This increases the reliability of the transistor devices.

Referring again to FIG. 4, the level shifter uses a feedback approach to shift the digital input signals to voltage levels ranging from −Vdd to +Vdd. Specifically, the output of the second group of inverters (308, 310, 312) on the second output node 316 (i.e., the "out_" signal) is provided as feedback to an input of the first group of inverters at the input of the inverter 304. Similarly, the output of the first group of inverters (302, 304, 306) on the first output node 314 (i.e., the "out" output signal) is provided as input to the second group of inverters; specifically, that output is provided as input to the inverter 310.

When the digital input signal on the input node 318 reaches a logical "high" state (i.e., in some embodiments, when the input signal transitions from GND to +Vdd), the "in" signal (at the node 324) and the "in_" signal (at the node 326) go to ground (e.g., 0 VDC) and Vdd (e.g., 3 VDC), respectively. The "out" signal at the first output node 314 is driven to +Vdd. At the same time, the "out_" signal at the second output node 316 is driven towards −Vdd. The feedback (of "out_" fed back to the input of the inverter 304 and "out" fed forward to the input of the inverter 310) configuration ensures the rapid change in state of the level shifter 300. The level shifter 300 works similarly when the input signal transitions from a logic high to a logic low state (i.e., transitions from +Vdd to GND). When the digital input signal on the input node 318 reaches a logic "low" state, the "in" signal (at the node 324) and the "in_" signal (at the node 326) go to Vdd (e.g., 3 VDC), and ground, respectively. The "out" signal at the first output node 314 is driven to −Vdd. At the same time, the "out_" signal at the second output node 316 is driven towards +Vdd. The feedback again ensures the rapid change in state of the level shifter 300. The grounding contribution ensures that the level shifter inverters never see more than a full Vdd voltage drop across the source/drain nodes of the MOSFET transistors of the inverters.

Figure 5:
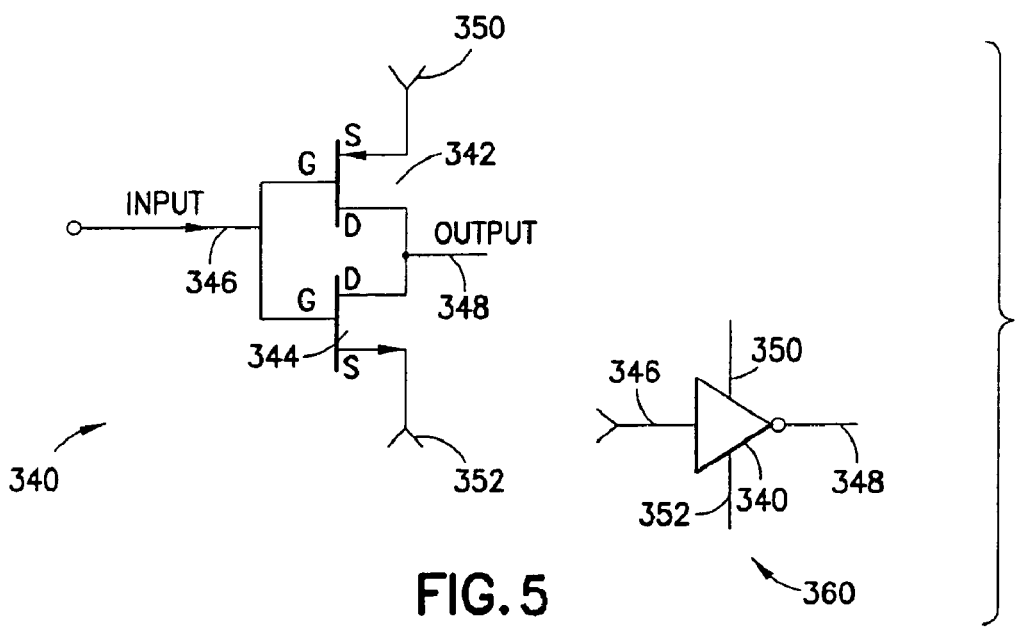
FIG. 5 is a schematic diagram of inverters that may be used to implement the level shifter shown in FIG. 4.

FIG. 5 shows inverters that may be used to implement the level shifter 300 of FIG. 4. As shown in FIG. 5, the inverter 340 includes two MOSFET devices, a P-channel transistor 342 and an N-channel transistor 344. The devices are connected in series as shown, having their gates coupled together and controlled by an input signal provided at an input node 346. The source of the P-channel transistor 342 is coupled to a first power supply voltage signal at node 350, while the source of the N-channel transistor 344 is coupled to a second power supply voltage signal at a node 352. The device drains are coupled together as shown to produce an output of the inverter at an output node 348. In one embodiment of the present inventive inverter 340, the P-channel transistor 342 has a width of 5 micro-meters and a length of 0.8 micro-meters. In-this embodiment, the N-channel transistor has a width of 2 micro-meters and a length of 0.8 micro-meters. Those skilled in the transistor design arts shall recognize that other physical dimensions can be used for the transistors of the inverter 340 without departing from the scope or spirit of the present invention. A logical representation of the inverter 340 is also shown as symbol 360 in FIG. 5.

Figure 6:
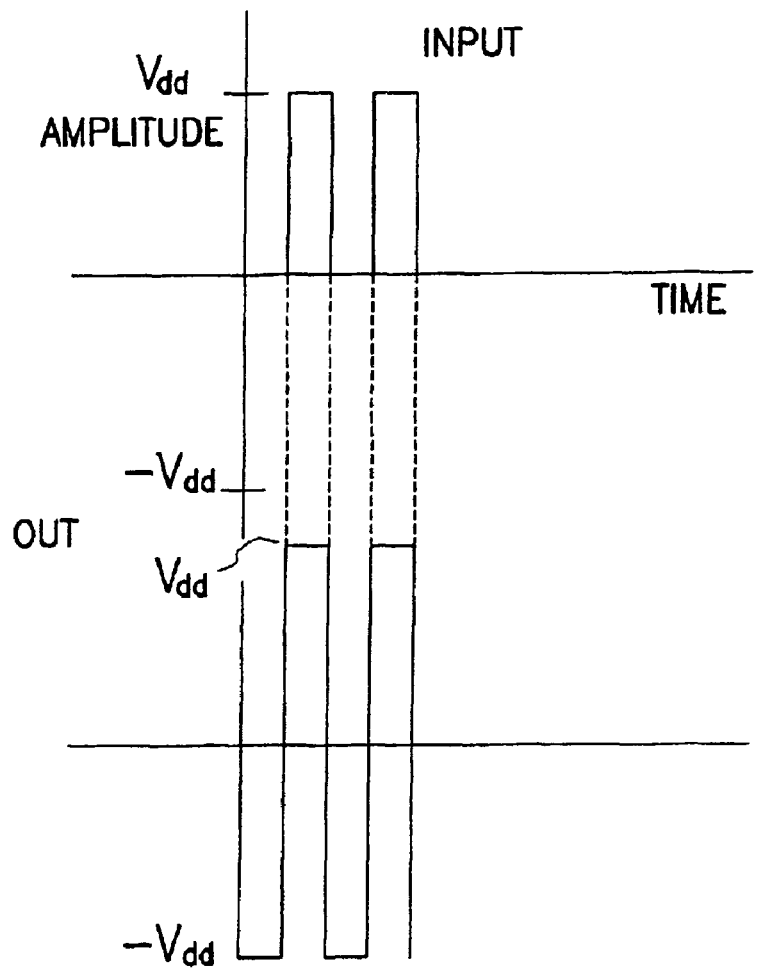
FIG. 6 illustrates input to output relationships of a level shifter such as represented in FIG. 4.

The level shifter 300 of FIG. 4 shifts digital input signals, which initially range from GND to +Vdd, to signals that range from −Vdd to +Vdd. FIG. 6 shows a voltage versus time plot of the digital input signal and the corresponding output signal that is generated by the level shifter 300. In FIG. 6, the digital input signal ranges from ground, or 0 VDC to Vdd. In one embodiment, the input signal ranges from 0 VDC to +3 VDC, and the output of the level shifter 300 ranges from −3 VDC to +3 VDC. Other values of power supply voltages can be used. In some embodiments, for example, the input signal can range from 0 to +3.5 VDC, or from 0 to 4 VDC. In these embodiments, the level shifter shifts the signal to range from −3.5 (or −4) VDC, to +3.5 (or +4) VDC.

Figure 7:
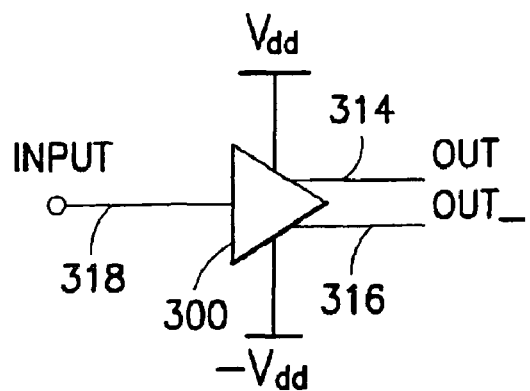
FIG. 7 is a simplified logic symbol for the level shifter of FIG. 4.

FIG. 7 shows a simplified logic symbol for the level shifter 300 of FIG. 4. This logic symbol is used in subsequent figures. As shown in FIG. 7, the digital input signal is provided on the input node 318 (the same input node 318 described above with reference to FIG. 4). The level shifter 300 provides two shifted outputs, "out" and its inverse "out_," and these are provided on output nodes 314 and 316, respectively (the same output nodes 314, 316 described above with reference to FIG. 4). There are many other ways to construct level shifters; moreover, buffers may be usefully added to isolate RF signals. Useful level shifters and buffers are described in detail in associated U.S. Pat. No. 6,804,502.

Harmonic Cancellation

As previously noted, slight distortions imposed on a signal that is coupled via an RF switch may cause energy to be introduced into the signal at harmonics of the operating frequency, Fo, of the signal. Such harmonic signal energy may limit the usefulness of the RF switch, generally by causing a device in which the switch is used to exceed a regulatory output limit at a particular harmonic frequency. When unwanted harmonic signals due to distortion cannot be avoided in practical designs, it may be useful to cancel at least portions of such signals. For example, it may be useful to cancel such signals at a selected harmonic frequency (Fsh) that is of concern for emissions compliance. In the exemplary embodiment described below, Fsh is the third harmonic of the operating frequency Fo, or 3(Fo). Other unwanted harmonic frequencies may be compensated for in a similar manner.

Figure 8:
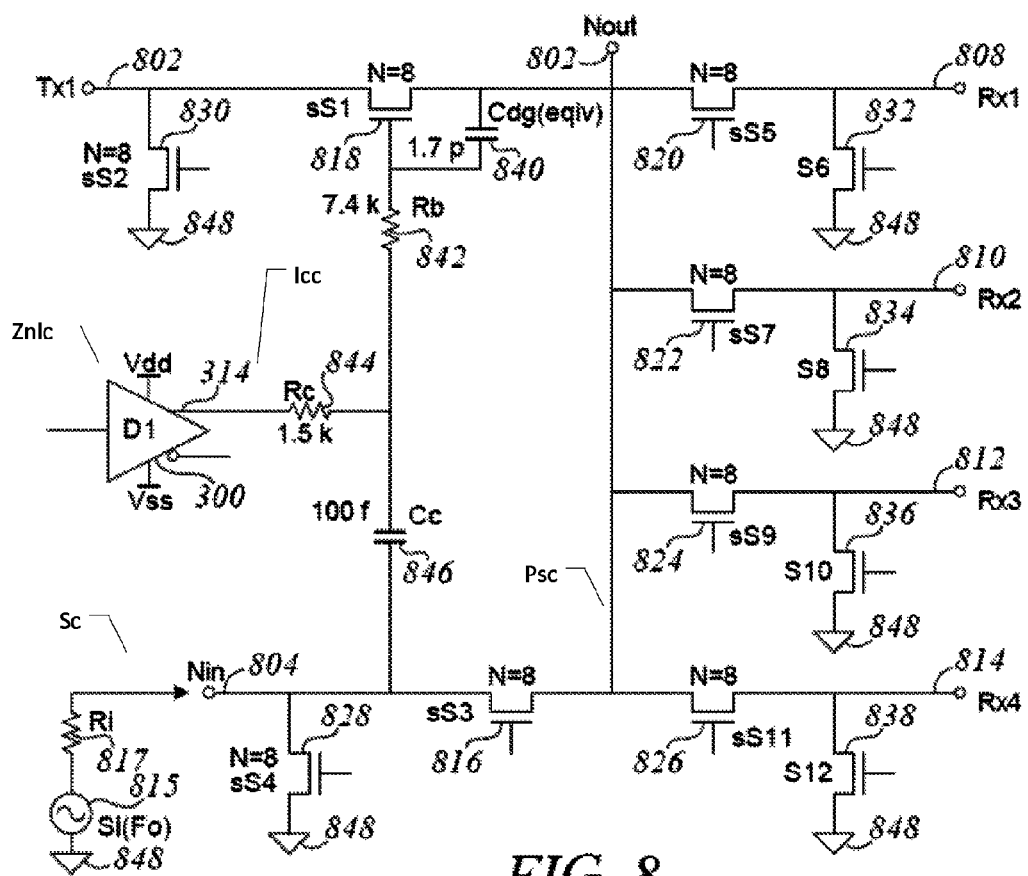
FIG. 8 is a simplified schematic diagram of a single pole multiple throw RF switch having features that cause both unwanted and compensating harmonic distortion.

A list of abbreviations is provided for reference:
Cac—alternative compensation capacitor
Ccc—compensation coupling capacitor
Ich—compensation harmonic current
Icc—conducted compensation current
Pch—compensation harmonic path
Pdi—distortion current path
Ppc—phase control path
Psc—signal conduction path
Sc—signal conducted (by the RF switch)
Sch—compensation harmonic signal
Sdh—unwanted harmonic distortion path
Sh—harmonic signal
vref—AC reference voltage
Zi—input impedance, ideally resistive
Znlc—compensation nonlinear impedance
Znld—distortion nonlinear impedance
Zpd—distortion path impedance
Zps—signal path impedance FIG. 8 is a simplified schematic diagram of an RF signal switching circuit. The circuit is designed for an operating frequency, Fo, of 825 MHz. The topology of the switching circuit is more complicated than that represented in FIG. 3, in that it includes six input nodes that can be selectably coupled to an output node Nout 802. The inputs include two transmit nodes Nin 804 and Tx1 806, as well as four receive nodes Rx1 808, Rx2 810, Rx3 812 and Rx4 814. To ensure that unselected inputs are fully decoupled from Nout 802, each of the unselected inputs may be coupled to circuit common via a clamp switch, thereby minimizing pass-through between the conducted signal and unselected inputs. Nin is coupled to an input signal Si 815 at an operating frequency Fo. The input source has an impedance, indicated as Ri 817, which is ideally purely resistive. The input impedance may also be referred to as Zi to reflect that it is potentially complex. The input to Nin 804 may, for example, be a relatively high-power transmit signal from a power amplifier. The output node Nout may, for example, be coupled to an antenna via a transmission line.

The switching elements of the RF switching circuit of FIG. 8 are primarily stacked FET switches such as are illustrated in FIG. 3. They are schematically represented, for convenience, using the same symbol as an ordinary insulated-gate FET. The stacked devices may be distinguished by their designation as "sSxx," and by the associated indication of the number N of FETs in the stack. The six inputs Nin, Tx1, and Rx1-Rx4 may be coupled to the output via sS3 816, sS1 818, sS5 820, sS7 822, sS9 824, and sS11 826, respectively. Each of these switching elements is a stack of 8 FETs, coupled in series, and their associated gate resistances, as is reflected in the notation "N=8" by each element. The transmit input clamp switches sS4 818 and sS2 830 must withstand the full transmit voltage when the associated input is active, and thus they are also stacked switches with N=8. However, because a transmit signal is never coupled to Nout 802 when a receive input is coupled to Nout, the clamps for the receive "inputs" Rx1-Rx4 need withstand only very small received voltages. As such, the corresponding clamp switches S6 832, S8 834, S10 836 and S12 838, respectively, may be single, low voltage FETs. Rx1-Rx4 (808-814) may be coupled to four different receive circuits.

Each of the inputs may be selectively coupled to Nout 802 to form different states, or conduction configurations. One state is generally of particular interest for harmonic signal generation. The state of greatest interest may be the one in which the highest power is handled, or which for some other reason causes unwanted harmonic emissions to approach regulatory limits. The state of greatest interest in the exemplary embodiment is that in which Nin 804 is coupled to Nout 802 via sS3 816 (which will be referred to as the signal conduction path Psc) while all other inputs are decoupled from Nout 802. In this state, sS1 818 is biased "off" and shunt switch S2 is biased "on" to reduce coupling between a circuit connected to Tx1 806 and Nout 802. For similar reasons, each of the stacked switch elements sS5 820, sS7 822, sS9 824 and sS11 826 is biased "off," while each of the shunt switches S6 832, S8 834, S10 836 and S12 838 is biased "on." Control for each switching element is provided by a driver. Only driver D1 300 is shown, but all drivers may be as illustrated in FIG. 7. In this state of interest, the driver D1 300 drives an output 314 low, to a negative supply, Vss, which is an AC common for the circuit, and which may have a DC voltage amplitude equal to −Vdd. The output stage of D1 300 may be fabricated like inverter 340 of FIG. 5. Applying the reference numbers from FIG. 5 for D1 in this state of interest, the FET 344 is active, with output 348 equal to output 314 of D1, and node 352 connected to Vss.

Figure 1A:
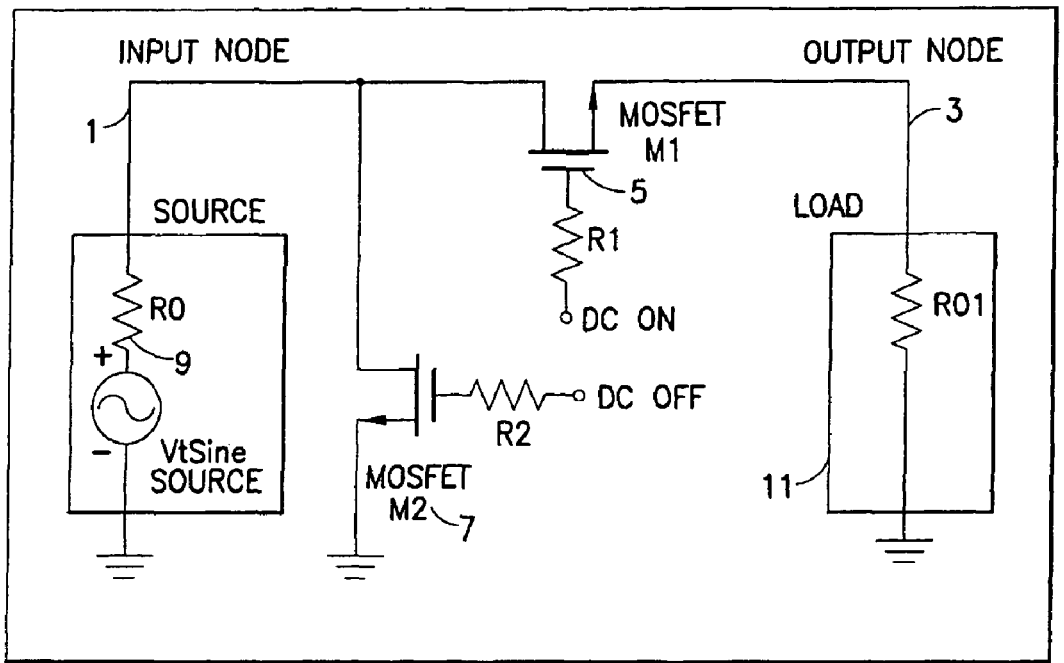
FIG. 1a is a simplified schematic diagram of a prior art single pole single throw (SPST) RF switch with source shunting.
Figure 1B:
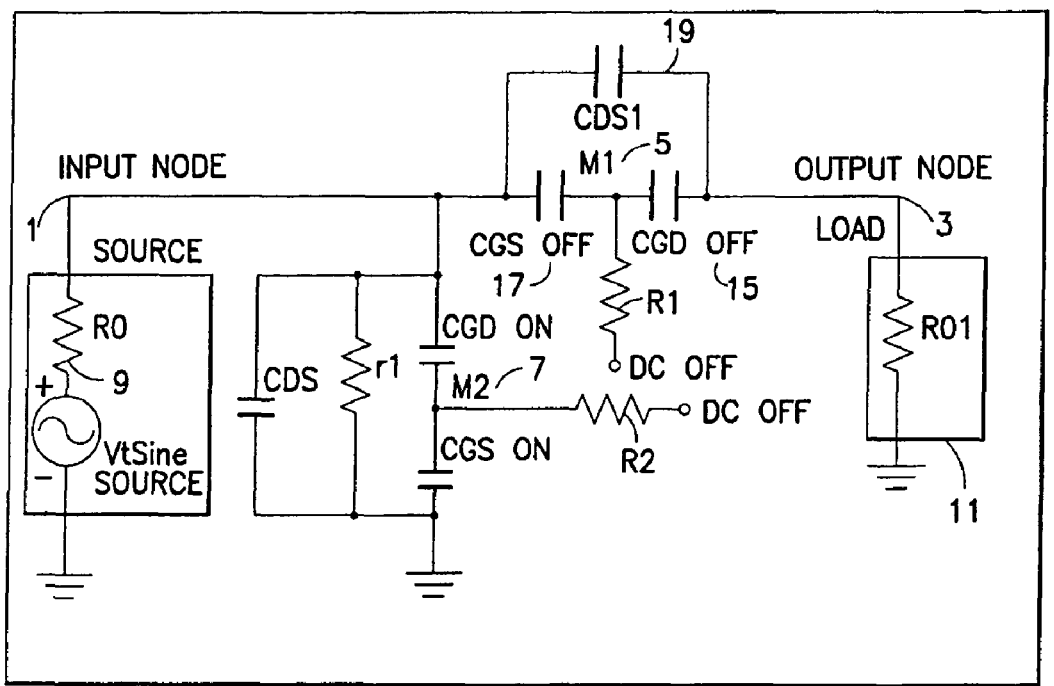
FIG. 1b additionally depicts parasitic elements.

The input signal Si may intrinsically include unwanted harmonic content. If such content is well understood, the switching circuit may be designed to compensate for it. However, RF switching circuits such as that shown in FIG. 8 may introduce unwanted harmonic content to the signal delivered to Nout 802, irrespective of any harmonic content received from the source Si. For example, stacked switching elements sS1 818, sS5 820, sS7 822, sS9 824 and sS11 826 are all coupled in parallel between Nout 802 and a circuit common. Each is biased "off," resulting in a high impedance that is limited at high frequencies by parasitic drain-source capacitance. Such capacitance is similar to Cds1 off 19 in FIG. 1b, except the net capacitance of the FET stack switching element sS1 is the series combination of 8 (N=8) drain-source capacitances. These capacitances are not linear, and consequently the current drawn by such capacitive impedance paths is distorted. The current that is drawn must be supplied by Si via the equivalent impedance Ri 817 (typically 50Ω resistive), so that the nonlinear current induces a small nonlinear harmonic distortion signal Sdh along the signal conduction path Psc, with respect to circuit common.

Figure 9:
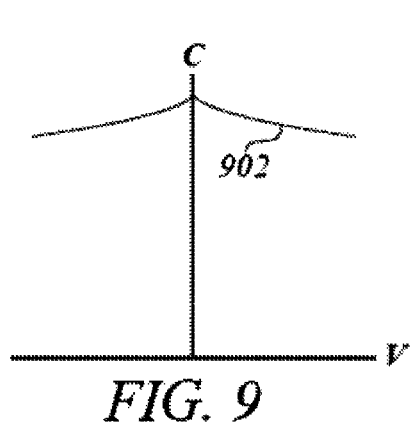
FIG. 9 is a graph qualitatively illustrating nonlinear capacitive impedance for some FETs when biased "off."

FIG. 9 illustrates, qualitatively, a nonlinear capacitance characteristic for "off" FETs. The curve 902 reflects capacitance per unit gate area. The peak value of capacitance occurs when the gate-source voltage is zero. As the drain-source voltage increases, regardless of polarity, the capacitance decreases. Consequently, the parasitic capacitive impedance of these devices is not constant throughout an applied voltage waveform. At the peaks of the applied voltage waveform, the capacitive impedance is significantly higher than as the signal passes through zero. Consequently, the resulting current is distorted, which means that it includes unwanted harmonic content, even if the input signal Si is a perfect sine wave.

Though the switching element sS1 818 is a stack of FETs, the net capacitance across sS1 818 follows the characteristics of the FETs of which it is comprised. Accordingly, each of the "off" switching elements sS1 818, sS5 820, sS7 822, sS9 824 and sS11 826 draws a certain amount of distorted, capacitive current from the signal path Psc at Nout 802 to an AC reference voltage (ground or circuit common). A distortion current path Pdi is a combination of all such paths. Pdi includes an equivalent nonlinear distortion impedance, Znld. Unwanted distortion current Idi resulting from the input signal Si impressed across Pdi (which includes Znld). Idi flows through the source impedance of the input signal Si, which may be 50Ω resistive as represented by Ri 817, establishing an unwanted harmonic distortion signal Sdh at Nout 802. Sh1, a component of the unwanted Sdh at a selected harmonic Fsh of the operating frequency Fo, is the subject of compensation techniques herein. The unwanted harmonic signal Sh1 may limit the range of usefulness of an RF switching circuit.

In the exemplary embodiment, Fsh is the third harmonic of Fo. Accordingly, Sh1 is a signal component of Sdh at Fsh, which is 3*Fo. Of course, the same considerations set forth herein for the third harmonic will apply, with appropriate adjustment, for other harmonic signals at any selected harmonic frequency Fsh. Unwanted harmonic distortion signals Sdh may result from many different mechanisms. Sh1 is targeted for compensation; however, it need not be generated by nonlinear conduction characteristics of "off" FETs, as in the exemplary embodiment. Indeed, Sh1 need not be generated by the semiconductor RF switching circuit at all, but may be caused by features external to the switching circuit. In other technologies, moreover, many different mechanisms may introduce the net effective nonlinear distortion impedance Znld that generates the unwanted distortion signal Sdh and its component of interest, Sh1 at the selected harmonic frequency Fsh.

Figure 10:
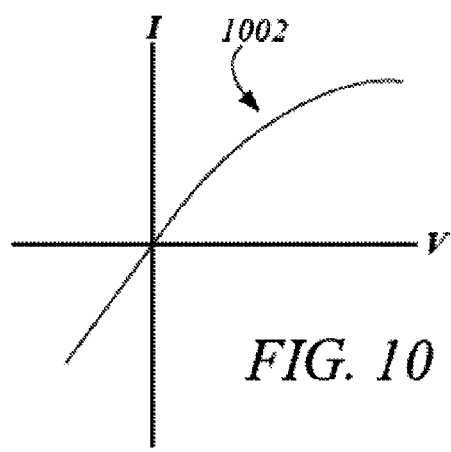
FIG. 10 is a graph qualitatively illustrating nonlinear impedance of some FETs when biased "on."

FIG. 10 illustrates, qualitatively, a nonlinear conduction characteristic for the "on" FET in D1 that couples the output 314 to Vss (e.g., FET 344 of FIG. 5, or a comparable device). For sufficiently low currents, the I-V curve is fairly linear. However, as may be seen at the inflection point 1002, conduction tends to be "compressed" as voltage increases above a certain value. Thus, the impedance of these transistors increases with increasing current. The nonlinear impedance of such a FET is substantially resistive, and thus is significantly different from the capacitive nonlinearity of "on" FETs that is described above with respect to FIG. 9. This difference between the nonlinear impedances results in phase difference in the harmonic signals that they produce. The resulting phase difference is usefully employed, in combination with a phase adjustment network, to establish phase opposition between a compensating harmonic signal Sh2 and the unwanted harmonic signal Sh1 at their frequency, Fsh. In the exemplary embodiment, the selected harmonic frequency Fsh is 3*Fo, or 2.475 GHz. The nonlinear conduction characteristic illustrated in FIG. 10 may thus help current into the output 314 of D1 to have a component at a selected harmonic frequency Fsh, for example the third harmonic frequency 3*Fo, to be in phase opposition to the current caused by the conduction of "off" switching elements such as sS1 818.

The D1 output harmonic current is used for compensation, and therefore is designated compensating harmonic current Ich. Ich flows through the source impedance (e.g., Ri) via two paths, which together form a harmonic compensation path Pch. First, current flows into output 314 via Cdg 840, Rb 842 and Rc 844. Cdg(equivalent) 840 has a value of about 1.7 pf, and thus the impedance of this path is characterized by a Bode plot "pole" at DC (0 Hz) and a "zero" at around 66 MHz. At the frequencies of interest (Fsh, about 2.45 GHz) Cdg approximates a short. Accordingly, the impedance of this first path is approximately 8.9 kΩ resistive at Fsh. The magnitude of this current can be adjusted, but constraints on the exemplary design limit the flexibility to tune this first component impedance of the harmonic compensation path Pch.

In the second path, a compensating capacitor Cc 846 is disposed between Nin 804 and Rc 844. Because this path is disabled in switching states other than the particular state of interest, it need not affect other switch conduction states. Cc 846 has a capacitance of about 100 ff. Accordingly, the impedance of this second path has a Bode plot pole at DC, and a zero at about 940 MHz. The impedance of this second path induces positive phase in Ich at Fsh. This second path also dominates the total Pch, because its impedance is roughly ⅓ that of the first path. These two paths together conduct the compensating harmonic current Ich through the compensating nonlinear impedance Znlc in D1 300, thus inducing a compensating harmonic signal Sch. More particularly, Ich conducted through Ri 817 generates a harmonic signal Sh2 at Fsh that is tuned to compensate for the unwanted harmonic signal Sh1 by being in phase opposition, and having similar magnitude, at a target input power Pin.

Of course, the specific values and even the circuit arrangement of this exemplary circuit are unique. The skilled person will find it necessary to apply the principles set forth herein to employ such cancellation in other embodiments. The skilled person will be familiar with many ways to construct appropriate compensation circuitry to achieve the desired result. For example, in the exemplary RF signal switching circuit, a corner frequency of the compensation path Pch is just slightly above Fo, causing phase shift at Fsh (at a value of 3*Fo). However, the corner frequency may well need to be varied. For various embodiments, Pch should include a corner frequency that is within two octaves of below Fsh, or within three octaves below Fsh, or within two octaves or three octaves around Fsh. In each case, a phase control path Ppc adjusts the phase of the harmonic compensation current Ich.

Figure 11:
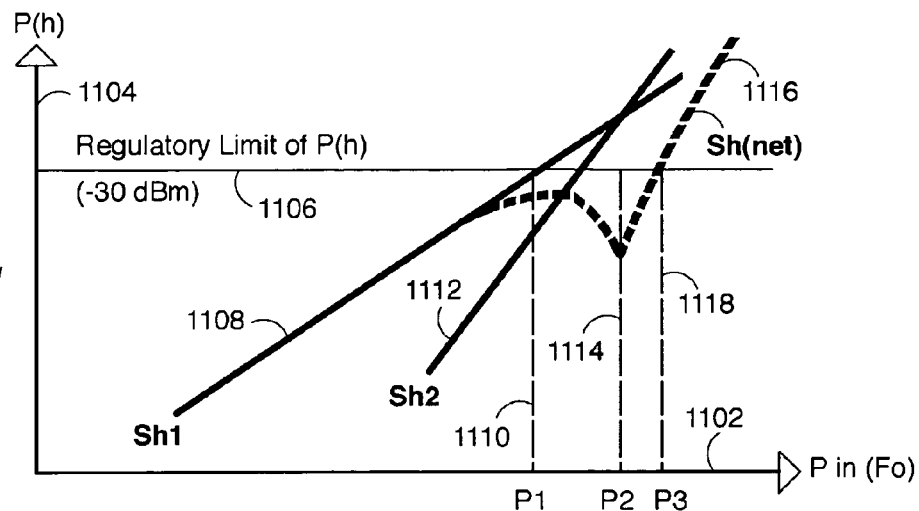
FIG. 11 illustrates individual and net harmonic contributions from two sources.

FIG. 11 illustrates the effect of the above-described compensation circuitry in canceling part of the unwanted harmonic distortion signal. FIG. 11 is a chart of the power of the conducted signal along the conduction path Psc at Fo (Pin (Fo) 1102 or "x" axis), versus the power of these two harmonic signals (P(h) 1104 or "y" axis). P(h) is measured only at the single harmonic frequency of interest, Fsh. In the exemplary embodiment, for example, Fsh is the third harmonic of Fo, and at 2.475 GHz is very close to the ISM band. As such, there is a stringent limit on emissions at this frequency. A relevant regulatory limit 1106 for P(h) is, in this case, constant at −30 dBm regardless of input power level Pin(Fo). The unwanted harmonic signal Sh1 (line 1108) crosses the regulatory limit 1106 when Pin reaches a value indicated by line 1110 (P1 watts). Consequently, if the unwanted harmonic signal Sh1 is not canceled, complying with these regulatory limits may require limiting the maximum power of a signal switched by the exemplary switching circuit to P1 watts.

Figure 12:
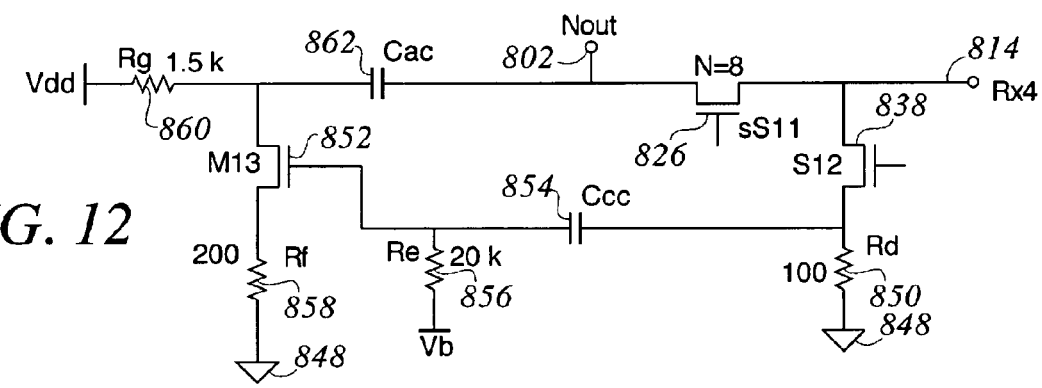
FIG. 12 is a simplified schematic diagram of alternative active harmonic cancellation circuitry for incorporation in an RF switch circuit such as represented in FIG. 8.

In the exemplary embodiment, some FET "on" impedances have a nonlinearity that is different enough from that of the "off" FETs that generate Sh1 to make such FET "on" impedance suitable for compensating for the unwanted harmonic signal Sh1. In the exemplary embodiment, the "off" FET impedance is a nonlinear capacitive impedance, while the "on" FET has a nonlinear impedance that is largely resistive. An "on" FET is used in the exemplary embodiment as a harmonic compensation nonlinear impedance Znlc. Current is conducted through Znlc to establish a compensation harmonic signal Sch, of which the component Sh2 at Fsh will cancel part of Sh1. The differences between these two nonlinear impedances, Znld and Znlc, help to establish Sh2 in phase opposition to Sh1 so that the signals cancel. However, other nonlinear impedances may also be used. The nonlinearities of Znld and Znlc may be substantially the same, such as is represented in FIG. 12, particularly if inverting amplification is available to create Sh2 in phase opposition to Sh1. For passive compensation circuitry, it will be useful to employ a nonlinear device having an impedance that varies oppositely from the distortion-inducing impedance Znld. Thus, if Znld is a compressive capacitive impedance that increases at higher voltages (as in the exemplary embodiment), Znlc may usefully be an expansive capacitive impedance that decreases at higher voltages. Even for nonlinear impedances that are substantially opposite in that manner, it will generally be necessary to further adjust the phase of the harmonic compensation current Ich in order to generate Sh2 in phase opposition to Sh1 through a desired range.

The conductive paths that cause the harmonic signals Sh1 and Sh2 have different nonlinearities, which aids in producing opposite phase signals. However, they also have different quantitative nonlinearity curves. Consequently, they do not have the same slope as a function of Pin. As shown, the harmonic compensation path Pch is tuned such that the power of Sh2 (at Fsh), indicated by the line 1112, is equal to the power of Sh1 (at Fsh) for a particular Pin value, P2 (indicated by dashed line 1114), that is greater than P1. The two signals are, at P2, approximately opposite in phase. Consequently, cancellation occurs, as indicated by the valley in the dashed line Sh(net) 1116 that indicates the net harmonic signal (Sh1 plus Sh2). When Pin=P2, Sh(net) is greatly reduced.

The magnitude and phase of Sh1 and Sh2 diverge as Pin deviates from P2, so cancellation of Sh1 by Sh2 is not perfect. Nonetheless, the net effect is that Pin may be increased to a value P3, indicated by dashed line 1118, before causing Sh(net) to exceed the regulatory limit on P(h) that is indicated by line 1106. Thereafter, as Pin continues to rise, Sh(net) will also rise. When Pin reaches P3, even the partially cancelled harmonic signal Sh(net) will reach the regulatory limit. However, by virtue of the intentionally added cancellation harmonic signal Sh2, the input power at which the RF switch may be properly operated is increased from P1 to P3. Varying circuits will have varying results, but (P3-P1) may typically be about 6 to 12 dB, substantially extending the compliant power range of the RF switch.

FIG. 12 is a simplified schematic diagram showing elements of an alternative approach for using conduction through a nonlinear impedance to generate a compensation harmonic signal Sh2 to cancel part of an unwanted harmonic signal Sh1. The circuit of FIG. 12 employs a compensating nonlinear impedance Znlc that is, in fact, a component of the distortion nonlinear impedance Znld, and thus has similar characteristics. Phase opposition is achieved by signal inversion in an amplification stage. Rx4 814 may be coupled to Nout 802 via sS11 826, as in FIG. 8. However, S12 830, rather than clamping Rx4 814 to circuit common when sS11 826 is off, may couple the high-impedance node to Rd 850 (about 100Ω). The signal developed on Rd due to nonlinear conduction through the "off" sS11 826 may be applied to an amplifying FET M13 852 via a compensation coupling capacitor Ccc (about 1 pf), providing a suitable bias voltage Vb via a bias resistor Re 856 (about 10 kΩ). Gain may be set using a suitable source resistance Rf 858 (about 200Ω), and a source resistor Rg 860 (about 1.5 kΩ). The alternative compensation may be coupled to Nout 802 via Cac 862. Phasing and amplitude will need to be established depending upon many factors, such as the percentage of the unwanted harmonic signal Sh1 that is created by sS11 826. Disadvantages of this alternative include the need for additional elements, as well as the modification to the clamping of the Rx4 input. However, useful cancellation may extend over a wider range of input power levels.

Figure 13:
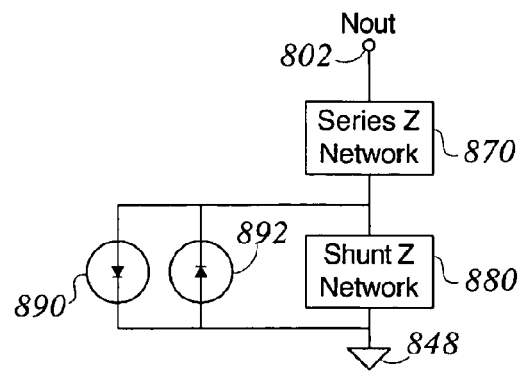
FIG. 13 is a simplified schematic diagram of alternative passive harmonic cancellation circuitry for incorporation in an RF switch circuit such as represented in FIG. 8.

FIG. 13 is a block diagram showing alternative passive means for generating a compensating harmonic signal Sh2 to appropriately cancel the unwanted signal Sh1. The circuit shown constitutes a harmonic compensation path Pch for use with an RF switch circuit that is otherwise like that of FIG. 8, except for the absence of Cc 846. This alternative Pch is coupled between the output node Nout 802 and the circuit common 848. A series impedance network 870, in combination with a shunt impedance network 880, provides amplitude and phase control. Diodes 890 and 892 provide a compensating impedance Znlc that is symmetrical about zero. Diodes 890 and 892 may be any comparable nonlinear devices, such as diode-connected FETs. The designer may have more flexibility to adjust the impedance characteristics of some devices than others. The impedance of diodes 890 and 892 reduces with increasing current. This is opposite to the distortion nonlinear impedance Znld of FIG. 8, and thus provides a compensating harmonic signal Sch that is different in phase. The series and shunt networks will generally need impedance having a pole or zero within three octaves of Fsh to adjust the phase of Ich. Ich, conducted through the input impedance Zi (ideally, Ri), will thereby generate the compensating signal Sh2 at Fo.

It should be noted that any harmonic cancellation circuit directed to a selected harmonic, such as the third harmonic in the exemplary embodiment of FIG. 8, is likely to cause changes of signal amplitudes at other harmonic frequencies as well. However, it is often the case that one particular harmonic signal is so dominant, as a limit on regulatory compliance, that substantial increases in other harmonic signals is of little consequence. In serendipitous circumstances, of course, more than one harmonic signal amplitude may benefit from a harmonic cancellation circuit as described.

Alternative Embodiments

One alternative set of embodiments includes a method of canceling harmonic distortion introduced by a semiconductor RF signal switching circuit. The method is particularly useful for modifying a semiconductor RF switch circuit that is configured to controllably conduct an input signal Si at an operating frequency (Fo) from an input node Ni to an output node Nout via a signal conduction path Psc having a signal path impedance of Zps. Modifying a circuit according to this method can effect partial cancellation of a harmonic distortion signal Sdh at a frequency Fsh that is a selected harmonic of the operating frequency Fo, where Sdh would otherwise be added to Si by the RF switch circuit. In some of these embodiments, Sdh is due primarily to conduction of Si from Ni to Nout via Zps that includes a nonlinear channel impedance of one or more "on" FETs. The method requires conducting harmonic compensation current Ich via a harmonic cancellation path Pch between Si and a reference voltage Vref to induce a harmonic compensation signal Sch on Si, where Pch includes a compensating nonlinear impedance Znlc, such that Sch cancels at least part of Sdh. In some embodiments, Znlc may include nonlinear gate-channel impedance of an FET that is biased "off" and disposed between Ps and a circuit AC common via a coupling network Nc of Pch to conduct Ich at Fsh. Si has an AC impedance Zi from Nout to circuit common, and in some embodiments, the method further includes adjusting the coupling network Nc such that a magnitude of Sch at Fsh, equal to Ich×Zi at Fsh, is approximately equal to a magnitude of Sdh when Si has a particular amplitude.

Further, more detailed examples of embodiments of the first alternative set of embodiments are defined by adding any combination of one or more of the requirements described below, such that each practical combination of the second harmonic cancellation method with one or more requirements below thus corresponds to an alternative embodiment of the method.

The particular amplitude of Si at which Sch is set approximately equal in magnitude to Sdh is selected to be within 6 dB above an amplitude of Si at which, in an absence of the cancellation harmonic signal Sch, the harmonic distortion signal Sdh reaches a limit based upon regulatory requirements. The cancellation harmonic signal Sch may be required to be substantially opposite in phase to Sdh. The coupling network Nc may be required to include a reactive element selected to adjust a phase of Ich by controlling a phase of Zpc at Fsh.

A further alternative set of embodiments includes an RF switch circuit configured to switchably conduct an input signal Si having an operating frequency Fo from an input node Nin to an output node Nout via a switch conduction path Psc. At least at Nout, Si includes an unwanted harmonic signal Sh1 at a selected frequency Fsh that is a harmonic of Fo. The RF switch circuit includes a harmonic compensation circuit that generates a harmonic compensation signal Sh2 by conducting current due to Si through a compensating nonlinear impedance Znlc, such that Sh2 significantly cancels Sh1 for a range of amplitudes of Si.

In some of this further alternative set of embodiments, first and second distortion networks for generating corresponding first and second signals Sh1 and Sh2 at a selected frequency Fsh that is a harmonic of Fo. The first distortion network introduces Sh1 at Nout by conducting a current due to Si through a nonlinear channel impedance of a FET that is biased "on." The second distortion network introduces Sh2 at Nout by conducting a current due to Si through a nonlinear capacitance of a FET that is biased "off." The RF switch circuit further includes a balancing network that is coupled to one of the two distortion networks so as to control an amplitude of a corresponding harmonic signal, which is either Sh1 or Sh2, such that a magnitude of Sh1 is approximately equal to a magnitude of Sh2 when Si has a particular selected magnitude. The balancing network may require configuration to affect a phase of its corresponding harmonic signal such that Sh1 and Sh2 have substantially opposite phasing when Si has the particular selected magnitude.

More detailed embodiments of the RF switch circuit described above may be defined by adding any combination of one or more of the requirements set forth below. Accordingly, each practical combination of the RF switch circuit described above with one or more of the requirements set forth below thus corresponds to a different embodiment of the RF switch circuit.

The distortion network that generates Sh2 may be required to comprise one or more FET paths that are configured, when biased "on," to couple a point of the conduction path Psc to a node that is distinct from Nin and Nout. Such FET paths may be required to comprise a plurality of FETs disposed in series connection. The distortion network that generates Sh1 may be required to be part of a FET-biasing drive circuit. If so, the FET-biasing drive circuit may be required to be an output of a level-shifting circuit. Also if so, the FET-biasing drive circuit may need to be coupled to a gate of a FET that forms part of the distortion network that generates Sh2. The balancing network may be required to couple a distortion network to Psc via a coupling network including a capacitor in series with a resistive impedance. If so, the balancing network may be required to affect a phasing of the corresponding harmonic signal by introducing a zero, having a corner frequency within two octaves of Fsh, into the function that generates the corresponding harmonic signal. Alternatively if so, the balancing network may be required to introduce a zero, having a corner frequency within one half octave of Fo, into the function that generates the corresponding harmonic signal.

A third set of alternative embodiments includes a method of canceling at least a portion of harmonic distortion introduced by a semiconductor signal switching circuit. The method is particularly useful for modifying a semiconductor RF switch circuit that is configured to controllably conduct an input signal (Si) at an operating frequency (Fo) to an output node via a signal path (Ps) having an impedance to circuit common value of Zps. Modifying a circuit according to this method can effect cancellation of a distortion signal (Sdh), at a frequency (Fsh) that is a selected harmonic of the operating frequency Fo, which would otherwise be added to Si by the RF switch circuit.

In some of the third set of alternative embodiments, the method includes locating a semiconductor output drive circuit that couples a first circuit node (N1) to an AC common voltage, where the output drive circuit has a nonlinear impedance that introduces a cancellation harmonic signal (Sch) at the selected frequency Fsh due to conducting current having a sinusoidal component at Fo. The method also includes coupling Ps to circuit node Ni via a cancellation path (Pc) through a resistive coupling element (Rc), whereby a harmonic compensation current (Ich) at Fsh, which is due to Sch, is conducted from Ps to the circuit AC common voltage. Finally, the method includes establishing an impedance (Zpc) of the cancellation path Pc such that a product of Ich and Zps has a magnitude approximately equal to that of the distortion signal Sdh, at least when Si has a particular amplitude.

A fourth set of alternative embodiments includes a monolithically integrated semiconductor switching circuit configured to selectably couple an input signal Si having an operating frequency Fo along a signal path Ps from an input node Ni to an output node Nout via a controllable switching element M1 comprising a multiplicity of series-coupled FETs. The switching circuit includes a first nonlinear device that induces an unwanted harmonic distortion signal Sdh, at a frequency Fsh that is a particular harmonic of Fo, onto Si at Nout. The switching circuit also includes a harmonic compensation path Pch disposed between the Ps and a circuit reference voltage Vref to convey a harmonic compensation current Ich via a network configured to control phase and amplitude of Ich as a complex function of frequency to a compensation circuit node Nc that reflects a distorted signal at Fo due to current from Ps coupled to Vref via a nonlinear impedance Znl. Sch, a compensating harmonic signal at Fsh that results from Ich, at least partly cancels Sdh at Nout over an amplitude range of Si.

In some of the fourth set of alternative embodiments, Nc reflects a distorted signal at Fo due to current coupled from Ps to Vref via a nonlinear capacitance; and the nonlinear capacitance may be the parasitic gate capacitance of one or more FETs. In some embodiments the distorted signal of Nc may be due to Ich coupled through a nonlinearly conducting FET; and in some, the distorted signal at Nc may be due to both current coupled via a nonlinear capacitance and Ich coupled through a nonlinearly conducting FET. Nc may be the output of a switch element drive circuit.

A number of embodiments of the present invention have been described. Nevertheless, it will be understood that various modifications may be made without departing from the spirit and scope of the invention. Accordingly, it is to be understood that the invention is not to be limited by the specific illustrated embodiments, but only by the scope of the appended claims.

What is claimed is:

1. A method of canceling unwanted harmonic signal component Sh1 at a frequency Fsh that is a selected harmonic of an operating frequency Fo of a signal Sc, the method comprising:
   a) conducting the signal Sc via an integrated semiconductor RF signal switching circuit along a signal conduction path Psc from an input node Nin to an output node Nout;
   b) contemporaneously conducting a compensation current Icc between Psc and an AC reference voltage vref via a compensation nonlinear impedance Znlc not modulated by the signal Sc, the nonlinearity of Znlc enhancing a suitability of Icc for compensation;
   c) developing a compensating harmonic signal Sh2 at the frequency Fsh as a component of Sc due to conduction of Icc through an impedance distinct from Znlc;
   d) wherein Sh2 has a phase and amplitude at Fsh related to a phase and amplitude of Sh1 at Fsh such that a sum of Sh1 plus Sh2 has a lower amplitude at Fsh than does Sh1 alone, across a target range of Sc amplitude.

2. The method of claim 1, wherein developing Sh2 in step (c) is primarily due to conducting Icc through an equivalent impedance of the conducted signal Sc.

3. The method of claim 1, wherein Znlc is a compressive nonlinear impedance that increases with increasing current.

4. The method of claim 3, wherein Znlc is a characteristic of a channel of an FET that is biased "on".

5. The method of claim 4, wherein Znlc is an output device in a driver circuit configured to bias "off" a switching element in an unselected alternative signal conduction path coupled to Nout.

6. The method of claim 1, further comprising generating the unwanted harmonic signal Sh1 by coupling a distortion current path Pdi, which includes a nonlinear distortion impedance Znld, between Psc and vref.

7. The method of claim 6, wherein unselected signal switching elements, including one or more FETs that are biased "off," substantially establish the nonlinear impedance Znld of the distortion path Pdi.

8. The method of claim 6, wherein Znlc and Znld have significantly different nonlinear characteristics.

9. The method of claim 8, wherein one of Znld and Znlc is substantially reactive, while the other of Znld and Znlc is substantially resistive.

10. The method of claim 1, further comprising controlling the phase and amplitude of Sh2 by causing Icc to be conducted via a phase control path Ppc that establishes a frequency-dependent impedance pole or zero within three octaves of Fsh.

11. A monolithic RF signal switching integrated circuit comprising:
   a) an input node Nin configured to receive an input signal Si having an amplitude Pin at an operating frequency Fo;
   b) a signal conduction path Psc that is selectable to couple the input signal Si at Nin to an output node Nout via a switching element including a channel of a transistor controllably biased to an "on" state as an output signal So; and
   c) compensation circuitry configured to contemporaneously generate a harmonic compensation signal Sch to cancel part of an unwanted harmonic distortion signal Sdh from So, the compensation circuitry including a compensation harmonic path Pch that conducts current from Si to an AC reference voltage vref via a compensation nonlinear impedance Znlc not modulated by the input signal Si, the nonlinearity of Znlc enhancing compensation of Sdh by Sch.

12. The integrated circuit of claim 11, wherein current through the compensation harmonic path Pch via Znlc is compensation current Icc, and the harmonic compensation signal Sch is primarily a product of Icc with an equivalent impedance Zi of the input signal Si expected to be received at Nin.

13. The integrated circuit of claim 11, wherein an impedance magnitude of Znlc increases with increasing current.

14. The integrated circuit of claim 13, wherein Znlc includes nonlinear conduction by an FET that is biased "on".

15. The integrated circuit of claim 11, wherein the input signal Si is expected to have an equivalent input impedance Zi, further comprising (d) a distortion current path Pdi disposed between Psc and vref, which in operation conducts a distorted current Id from Psc that induces the harmonic distortion signal Sdh as a product of Id * Zi.

16. The integrated circuit of claim 15, wherein the distortion of current path Pdi is due to a nonlinear distortion impedance Znld of Pdi, and Znld has a much different phase than the compensating nonlinear impedance Znlc at Fsh.

17. The integrated circuit of claim 16, further comprising one or more unselected signal conduction paths including FETs, and having nonlinear impedances that together substantially establish Znld from the impedance of one or more FETs that are biased "off", and Znlc is substantially due to an impedance of one or more FETs that are biased "on".

18. The integrated circuit of claim 11, wherein the compensation harmonic path Pch further comprises a phase-magnitude control circuit having a frequency-dependent impedance pole or zero at a selected corner frequency that is within three octaves of a selected frequency Fsh that is a harmonic of the operating frequency Fo.

19. The integrated circuit of claim 11, further comprising a plurality of controllable conduction path switch elements that each include a multiplicity of FETs stacked in series and biased on or off together.

20. An integrated circuit apparatus for coupling RF signals from a selectable one of a plurality of input nodes including Nin to an output node Nout, comprising:
   a) means for inducing an unwanted harmonic signal Sh1 onto an input signal coupled to Nout, the means including an integrated semiconductor RF signal switching circuit; and
   b) compensation means for contemporaneously inducing a compensating harmonic signal Sh2 onto the input signal coupled to Nout, such that a magnitude of (Sh1+Sh2) is lower at a selected harmonic frequency Fsh for a target range of amplitude of the input signal, the compensation means including a compensation harmonic path Pch that is configurable to conduct a compensation current Icc from Nout to a reference voltage vref via a compensation nonlinear impedance Znlc not modulated by the signal Sc having a nonlinearity that introduces compensating harmonic content to Sh2.

* * * * *